United States Patent [19]

Booth

[11] Patent Number: 5,359,497
[45] Date of Patent: Oct. 25, 1994

[54] PLANAR TRIODE PULSER SOCKET

[75] Inventor: Rex Booth, Livermore, Calif.

[73] Assignee: Regents of the University of California, Oakland, Calif.

[21] Appl. No.: 58,370

[22] Filed: May 10, 1993

[51] Int. Cl.⁵ .............................................. H03K 7/02
[52] U.S. Cl. ...................................... 361/807; 29/840
[58] Field of Search ................ 29/832, 837, 840, 842, 29/843; 174/35 CE, 35 TS, 35 C; 333/12; 361/329, 734, 728, 760, 736, 763, 738, 767, 772, 774, 807, 808; 439/620

[56] References Cited

U.S. PATENT DOCUMENTS 4,827,378  5/1989  Gillan et al. ..................... 361/736

Primary Examiner—Leo P. Picard
Assistant Examiner—D. Sparks
Attorney, Agent, or Firm—Henry P. Sartorio

[57] ABSTRACT

A planar triode is mounted in a PC board orifice by means of a U-shaped capacitor housing and anode contact yoke removably attached to cathode leg extensions passing through and soldered to the cathode side of the PC board by means of a PC cathode pad. A pliant/flexible contact attached to the orifice make triode grid contact with a grid pad on the grid side of the PC board, permitting quick and easy replacement of bad triodes.

20 Claims, 9 Drawing Sheets

PLANAR TRIODE PULSER SOCKET

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The invention lies in the field of electro mechanical arts and in particular applies to mounting means or sockets for electrical components. More specifically the invention relates to mounting means and socket for planar triodes.

2. Description of Related Art

Over a period of several years, various circuit techniques and special sockets have been developed to enable routine use of a Y-690 planar triode in high power circuits. A Y-690 planar triode, illustrated in FIG. 1, consists of a cylindrical ceramic body 12 and metal contact elements; the positive anode 14 element (plate) which is positioned at one end of cylinder body 12 in the manner of an extended, threaded bolt, and the negative cathode 16 element protrudes in a circumferential ring around the opposite end of cylinder body 12 with a cathode heater filament 18 extending from cylinder body 12 end opposite anode 14. The third element, the grid 20, extends in a second protruding circumferential ring around cylinder body 12 between the anode 14 and cathode 16.

With such conventional triode contact elements, there is no existing standard socket or mounting fixture to incorporate the planar triode into an electrical circuit and in particular into a high power pulse generator. Prior attempts involved screwing the anode into a threaded female socket, and attaching circular rings or semi circular rings and clips to the periphery of the cathode and grid structure, with a friction socket utilized to couple the heater filament. However, such slip ring contacts and bolt and nut connections tend to loosen in time, work themselves free in a mobile or corrosive environment, and subsequently may occasionally break electrical contact. In addition, loose contacts might totally break loose in a rapid movement environment and completely sever a connection or cause undesirable and dangerous short circuit electrical arcing.

Alternatively individual solder joints could be made at each terminal of the triode and filament. Such coupling, however, is inconveniently time consuming to incorporate a triode into a circuit or to remove a faulty triode therefrom, and may also cause heat damage to the triode in the solder process as well. Under all prior methods and apparatus for adapting a planar triode to a circuit, there invariably was no known means for quickly, conveniently and steadfastly securing a planar triode in a circuit. There remains a long standing and continuing need for a planar triode socket without the inherent limitations of the prior art, which need is fulfilled by the invention disclosed herein.

OBJECTS OF THE INVENTION

Therefor, a primary object of the invention is to mount a planar triode in a manner to improve the functional/operational characteristics thereof, while at the same time utilizing an inexpensive and conveniently available and easily adaptable PC board environment.

Another object is to enable a planar triode in a series of stages to obtain the highest possible gain per stage and to transmit pulse power from the triode plate (anode) of that triode to the grid or grids of a succeeding stage triode(s) with an efficiency of nearly 90 percent.

Another object is to supply a grid current orthogonal to the cathode-anode current to limit or inhibit inductive interference.

Yet another object is utilize a planar triode in a pulse generation circuit consisting of a plurality of stages to generate nano-second risetime and kilovolt amplitude pulses.

Still another object is to transmit pulse power moving within a planar triode entirely by a low loss transmission line system which incorporates plate and grid blocking capacitors.

Another object is maintain a maximum impedance mismatch within the planar triode circuit of less than 10 percent.

These and other objects of the invention will become more readily apparent in view of the following disclosure, the attached drawing and the appended claims.

SUMMARY OF THE INVENTION

According to the present invention, the foregoing and other objects of the invention are obtained by a quick assemble mounting device or socket for planar triodes in general. The socket consists of a rectangular piece of PC board through which the planar triode is positioned via a circular cutout/orifice centrally disposed therein and of a diameter slightly larger than that of the triode. Bronze finger stocking is circumferentially and firmly affixed around the periphery of the orifice for making firm electrical contact with and securely holding the circumferential cathode ring element of the planar triode. Additional PC board extensions removably clamp down on the circumferential grid ring and hold the triode in place. A circular brass grid ring with a pair of opposing flanges is circumferentially positioned in a circular recessed area of the PC board concentric with and of larger diameter than said circular cutout. The grid ring flanges are configured to make firm contact with the grid ring element of the triode and the grid conductive pad on the PC board. A triode retaining yoke is configured to be positioned over and make firm contact with the anode through a set of large capacitors to yield a high power coax output. Flange leg extensions releasably bolted to the yoke are designed to pass through slots in the PC board and are firmly soldered to the cathode conductive pad of the PC board on the opposing side thereof to make a firm structure and provide a positive contact ground return for the anode output. Appropriate input and output electronic coupling leads are bolted or soldered to the PC board along with appropriate terminating resistors and capacitors.

DETAILED DESCRIPTION OF THE INVENTION

The planar triode socket system disclosed herein is designed to provide maximum pulse voltage at the grid of the triode by minimizing signal loss due to impedance mismatch, and also by controlling degenerative signal effects caused by the EMF generated at the cathode by the buildup of cathode current. This is achieved by locating the grid drive to pass as close as possible to the cathode structure of the triode, and by placing the grid drive at right angles to the anode (plate) ground return structure. By such means the degenerative effect of cathode current buildup is reduced to ten percent of a grid input pulse for a 1 ns risetime pulse.

Figure 1:
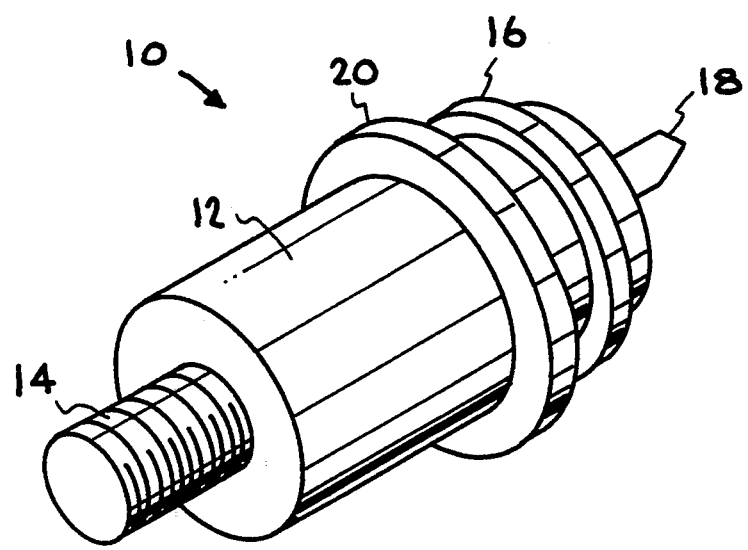
FIG. 1 illustrates a perspective view of a Y-690 planar triode.

The Y-690 planar triode, 10 illustrated in FIG. 1, is a cylindrical triode of ceramic and metal construction, designed for use in airborne, ground and space applications, as a grid or plate pulsed oscillator, amplifier or frequency multiplier up to 2.0 GHz and up to 12 kV. A ceramic vacuum enveloped body 12 is provided with an anode 14 element in the form of a threaded bolt on the near end of ceramic body 12. The cathode 16 element consists of a circumferential flange ring positioned on a distal end of the ceramic body 12. A cathode heater of the triode is operated upon by a heater filament 18 contact at the distal end of the triode. The grid 20 element also consists of a circumferential flange ring of slightly larger diameter than the cathode 16 ring and is positioned distal to anode 14 and between anode 14 and cathode 16.

Figure 2:
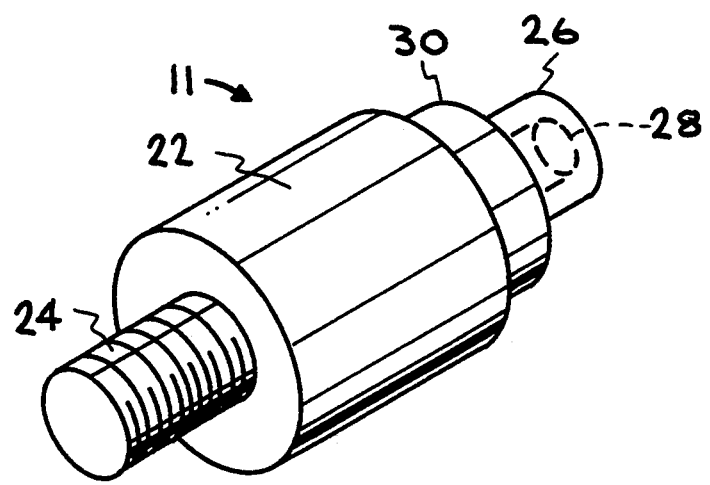
FIG. 2 illustrates a perspective view of an 8755 planar triode.

The 8755 planar triode 11 illustrated in FIG. 2 is a miniature, ceramic/metal, rugged planar triode also designed for advanced airborne and space applications up to 3.0 GHz and may be used as an amplifier, oscillator, or frequency multiplier in the grid or plate-pulsed mode, especially in applications where high RF pulse power is required.

The 8755 triode, like the Y-690, includes a vacuum enclosed ceramic body 22 with an anode 24 element in the manner of a threaded bolt at a near end of body 22 and a cathode 26 element in the form of an open cylinder extending from a distal end of ceramic body 22. A cathode heater filament 28, illustrated by hidden lines likewise extends as an open cylinder of smaller diameter and within cathode 26. The grid 30 element, between anode 24 and cathode 26 extends as an open cylinder of larger diameter and shorter length than cathode 26.

Figure 3:
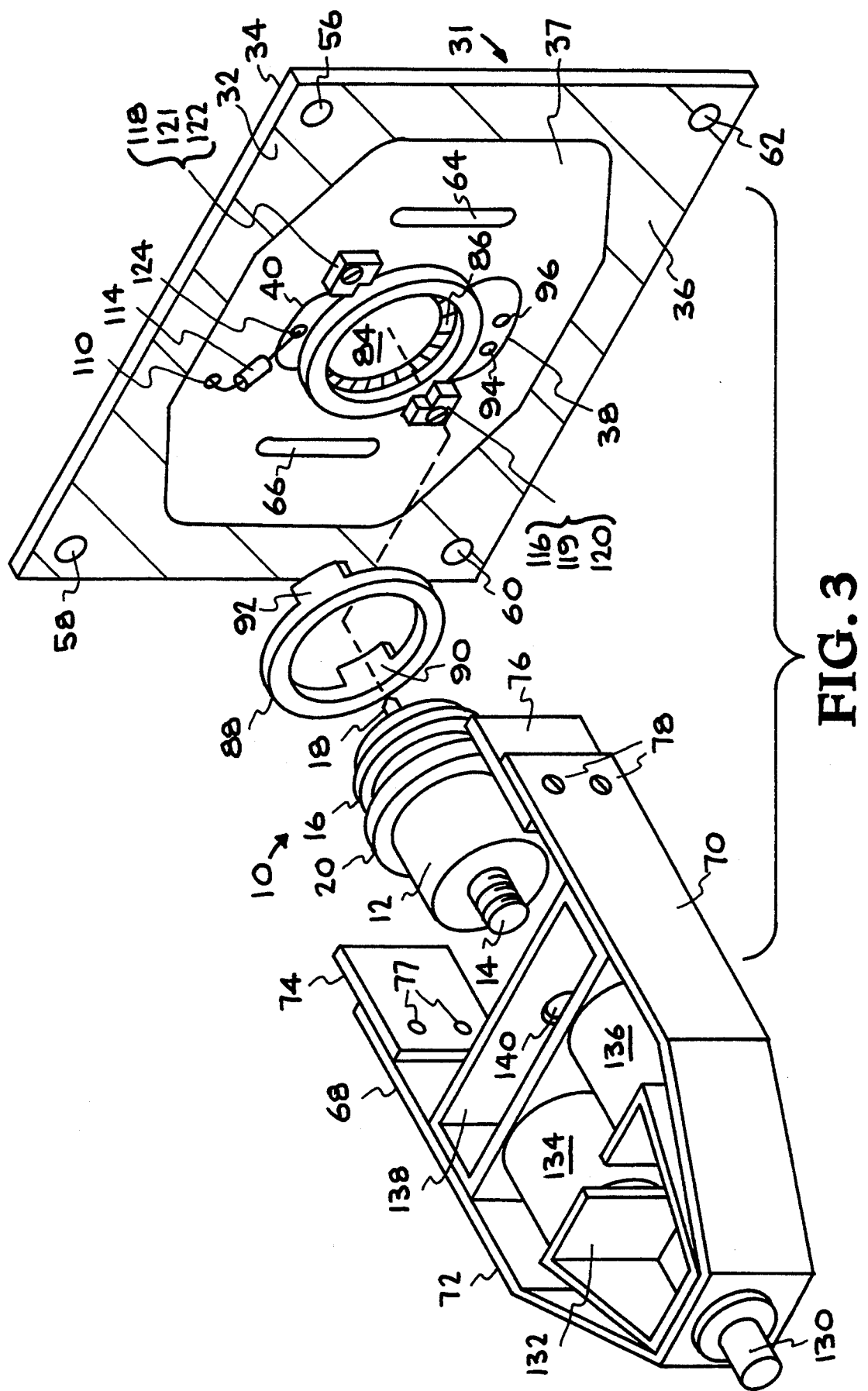
FIG. 3 illustrates a disassembled perspective view of the grid side of the Y-690 version of the invention socket.

Referring now to FIG. 3, an exploded or disassembled view of the Y-690 embodiment of the invention is illustrated. The primary mounting platform for the Y-690 planar triode socket is a 125 mil, double sided, 3"×4" rectangular printed circuit board (PCB) 31 having a grid side 32 illustrated in FIGS. 3 and 4 and a cathode side 34 illustrated in FIG. 5. PCB 31 provides isolation of the triode cathode contact element 16 from signal ground of PCB 31 support structure attached to a peripheral etched conductive layer 36.

Figure 6B:
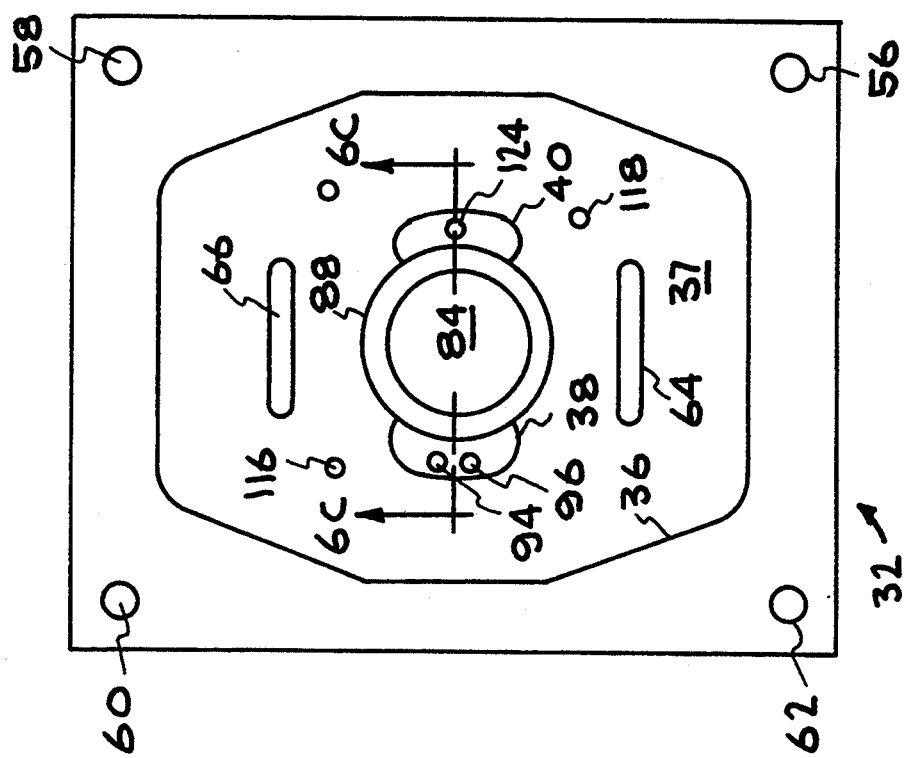
FIG. 6b illustrates the conductor coated, grid side view of the Y-690 version PC board.
Figure 6A:
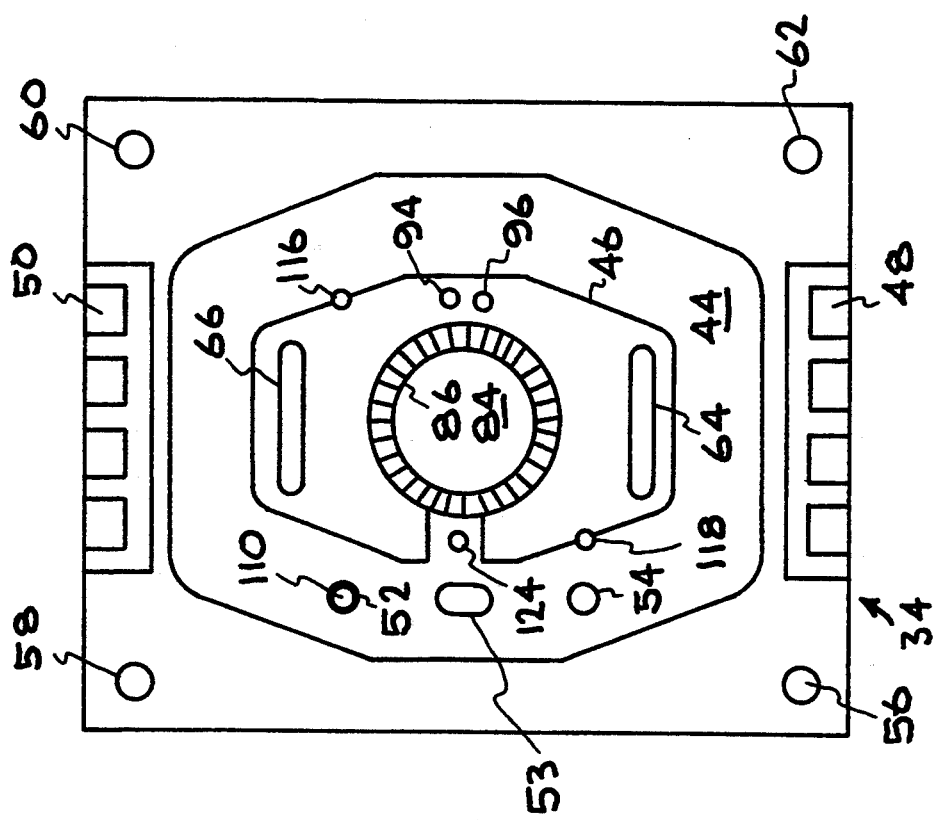
FIG. 6a illustrates the conductor coated, cathode side view of the Y-690 version PC board.

Grid side 32 as illustrated in FIG. 3 and more clearly in FIG. 6b is layered or etched with a second grid conductive, peripheral layer 36 (shaded in the drawing) leaving a central octagonal shaped nonconductive area 37 enclosing a pair of first grid conductive contact layers 38 and 40. It should be understood that FIGS. 6a, 6b, and 6d are actual PC board conductive layer lay outs.

Cathode side 34 of PC board 31, illustrated in FIGS. 5 and 6a, again depicts a peripheral second cathode conductive layer 42 (shaded area) leaving a central octagonally shaped nonconductive area 44 which in turn surrounds another octagonally shaped first cathode conductive layer 46 (shaded area). A pair of oppositely positioned edge connector conductive pads 48 and 50 with four terminals each are also etched into cathode side 34, and three small conductive layer component pads 52, 53, and 54 are provided for discreet component attachment.

Figure 6D:
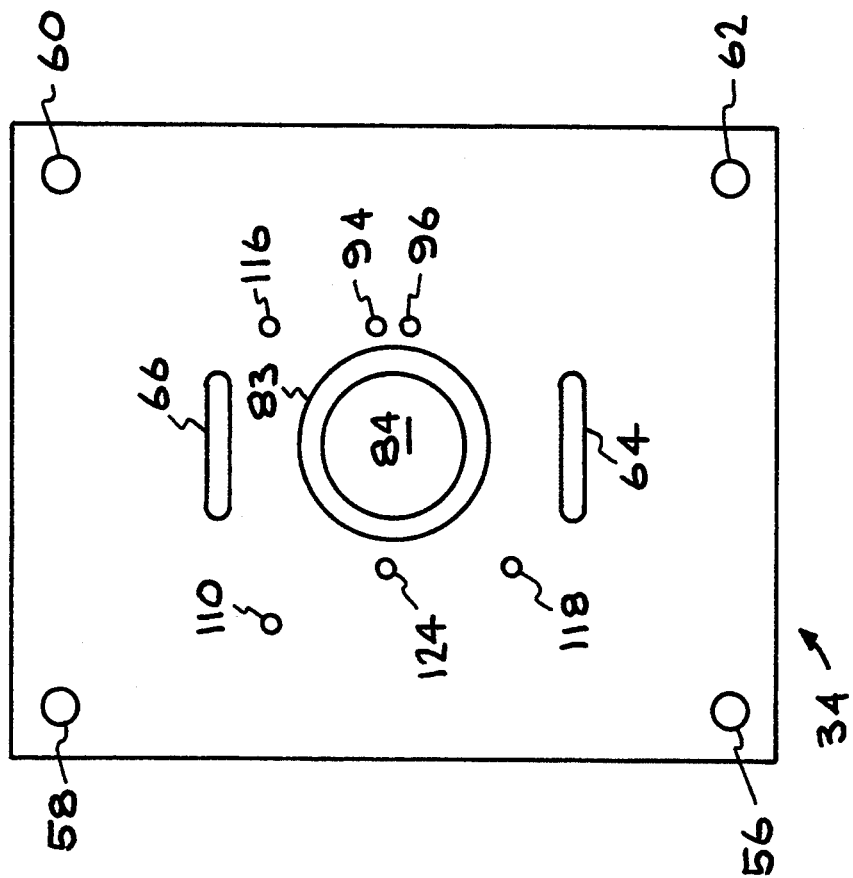
FIG. 6d illustrates the cathode side view of the cut out holes for the Y-690 version PC board.

Referring to FIG. 6d, appropriate holes and cut out sections are illustrated in a cathode side view of the Y-690 triode socket. Four corner holes 56, 58, 60 and 62 are provided for convenient mounting of PC board 31 or for mounting and passing electrical components therethrough.

Referring again to FIGS. 3 and 4 as well as FIG. 6d, a pair of elongated slots 64 and 66 are provided in PC board 31 for removable attachment of first and second legs 68 and 70, of a triode retaining yoke 72. Legs 68 and 70 may be 0.75" by 0.06" brass bars which act as ground return routes from anode output to cathode input. Length and shape of ground return legs 68 and 70 may vary depending on the particular transmission line system used and whether triodes are used in parallel. Retaining yoke 72 is provided with first and second leg extensions 74 and 76 connected to retaining yoke 72 on either side by screw holes 77 and machine screws 78 illustrated in FIGS. 3 and 4. Leg extensions 74 and 76 are configured to be inserted through slots 66 and 64 respectively and soldered at 80 and 82 to conductive layer 46, as illustrated in FIG. 5.

Figure 6C:
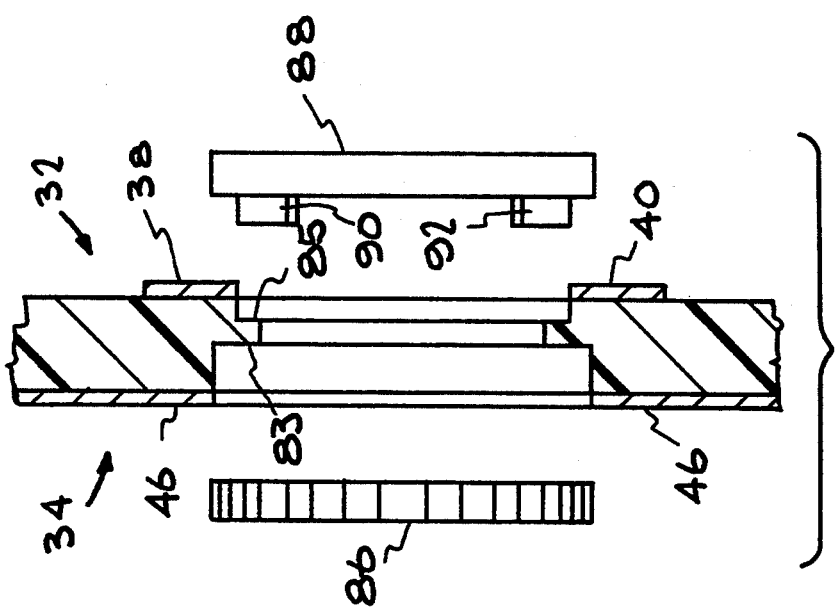
FIG. 6c is a cross section of the central cutout of FIG. 6b.

Referring again to FIG. 6d, which is another view of cathode side 34 without the conductive coatings, a layout of all specific holes and slots is indicated that need be bored either before or after conductive coatings 42 and 46 are applied to PC board 31. A centrally positioned, triode hole of a diameter slightly larger than the cathode 16 flange element of the Y-690 triode of FIG. 1 is provided with a bore of two different diameters 83 and 85 as illustrated by cross section FIG. 6c of FIG. 6b. On the cathode side 34, a first circular ring of finger stocking 86 is embedded and permanently affixed to the periphery of the cathode side 34 at triode hole 84. On the grid side 32, a circular grid ring 88 with a pair of ring extensions 90 and 92 is positioned in triode hole 84 and permanently soldered to conductive pads 38 and 40, respectively.

Referring again to FIGS. 6d and 5, a pair of grid control and cathode power holes 94 and 96 are provided for a pair of 25Ω coax cables 98 and 100 respectively with the external shields 102 and 104 thereof being soldered to conductive pad 46 and the internal leads 106 and 108 thereof passed through holes 94 and 96 and soldered to conductive pad 38 on grid side 32 which in turn is coupled to grid ring 88 and grid 20 of planar triode 10 illustrated in FIG. 3. It should be understood that grid ring 88 fits up under and is snugly attached to grid 16 flange, when planar triode is mounted in triode hole 84.

Figure 5:
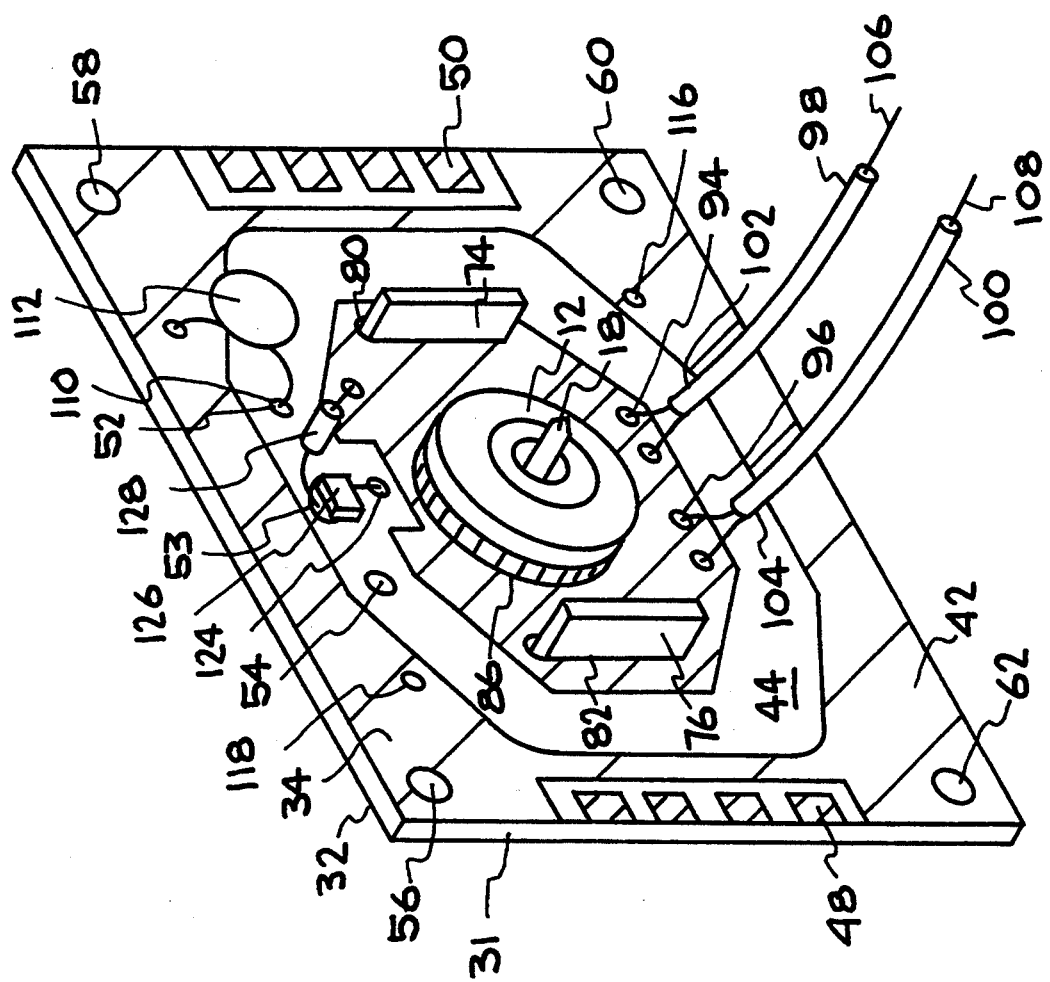
FIG. 5 illustrates a perspective view of the cathode side, opposite side, of FIG. 4.

Referring again to FIG. 6d, a capacitor hole 110 couples a bypass capacitor 112, FIG. 5, from a grid bias voltage resistor 114, FIG. 3, to effective system ground on conductive pad 42, FIG. 5, which prevents any signal from coming out of the socket by passing signal to ground and further allows D.C. voltage on grid 20.

Figure 4:
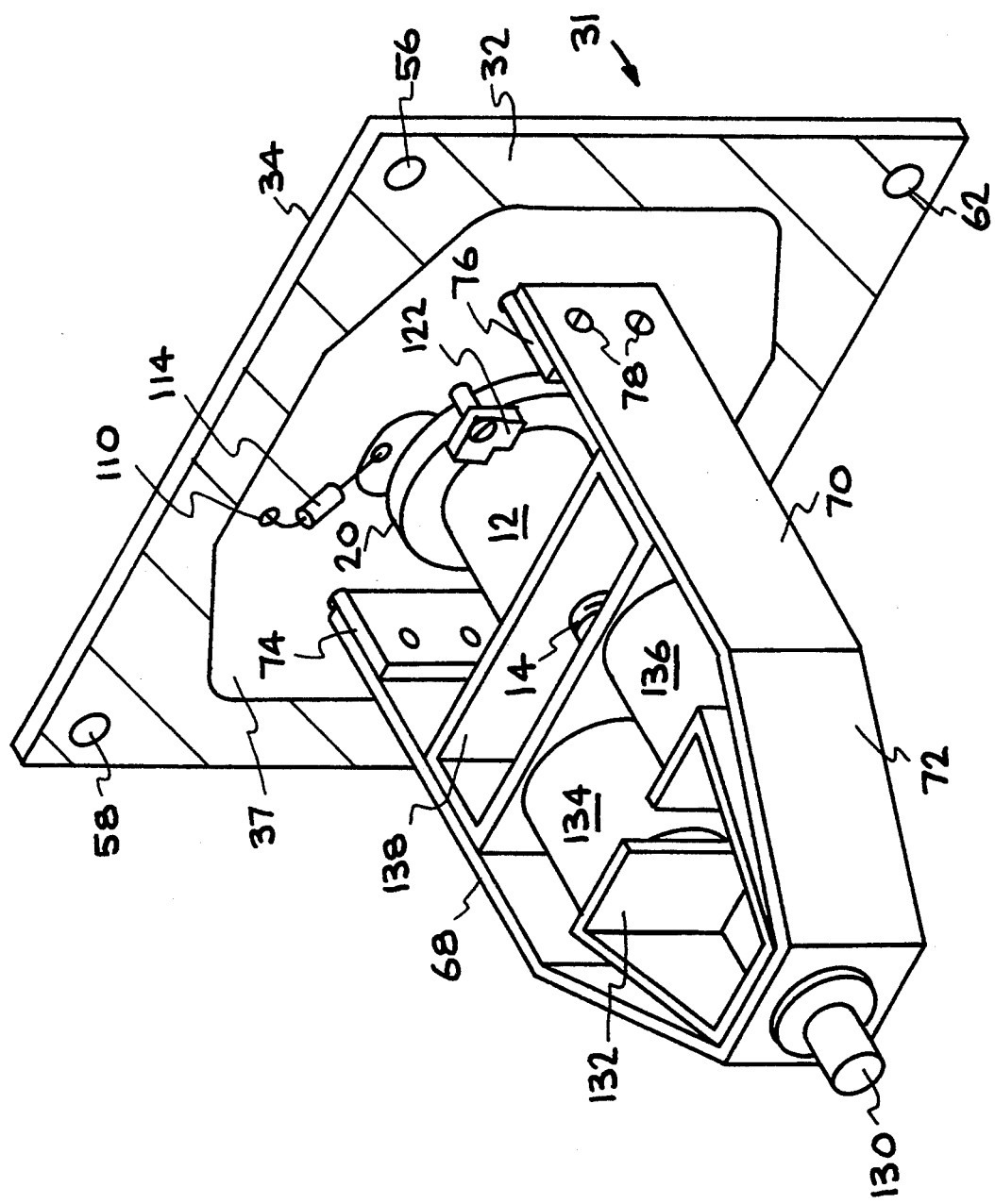
FIG. 4 illustrates an assembled perspective view of the grid side of the Y-690 socket.

An opposing pair of bracket holes 116 and 118 of FIG. 6d are provided for insertion of and tightening down bracket screws 119 and 121 on first and second L-shaped grid holding brackets 120 and 122, illustrated in FIGS. 3 and 4. The final blocking capacitor hole 124 of FIG. 6d allows a 200 V/0.02μF blocking capacitor 126, FIG. 5, to be coupled via pad 53, through hole 124 to pad 40 and grid ring 88, FIG. 3. A second 15Ω terminating resistor 128 couples capacitor 126 to pad 46 and acts as a D.C. ground for grid and anode drive, again to terminate the input signal and prevent reflection thereof.

Referring again to FIGS. 3 and 5, triode retaining yoke 72 consists of a somewhat U-shaped brass bar. A coax output connector 130 maintains in position a somewhat flexible V-shaped brass bar 132 within yoke 72 to which is fixedly mounted and soldered a pair of large plate blocking capacitors 134 and 135 and a rectangular shaped brass bar anode housing 138. Housing 138 has a circular hole 140 for insertion therethrough and contact thereof of anode/plate 14. Although not illustrated, rectangular brass housing may alternatively be a brass cylinder surrounding anode 14 and soldered to capacitors 134 and 136.

It will be apparent that planar triode 10 is firmly held in place and tightly in electrical contact by pressure of anode enclosure 138, by swiveling L-shaped brackets 120 and 122, and by flexible cathode coupled finger stocking 86. If a triode goes bad, a new triode may be quickly and easily inserted by unscrewing yoke extension screws 78, allowing yoke 72 to be removed and by loosening bracket screws 119 ad 121, allowing L-shaped brackets to be turned. The planar triode may then be easily pulled out and a new one fixedly inserted by reversing the foregoing process.

Large plate/anode blocking capacitors 134 and 135 in the realm of 0.02 μF/10 kV Glassmike caps must be incorporated into the transmission line structure as disclosed herein to achieve the fastest possible pulse risetime. With four such plate capacitors in parallel operating at an impedance of 50Ω, intrinsic risetimes of 300ps can be obtained; however, for pulses less than 50ns wide, any high voltage ceramic capacitor, particularly monolithic units, will work well also. Generally plate coupling capacitors properly mounted in transmission lines will not degrade the risetime of 1 ns pulses. Larger output capacitance would be needed if the Y-690 is to be operated with a 500ns pulse output. Minimum capacitor value required in such applications is about 0.1 mF for a 50Ω plate structure.

Figure 7B:
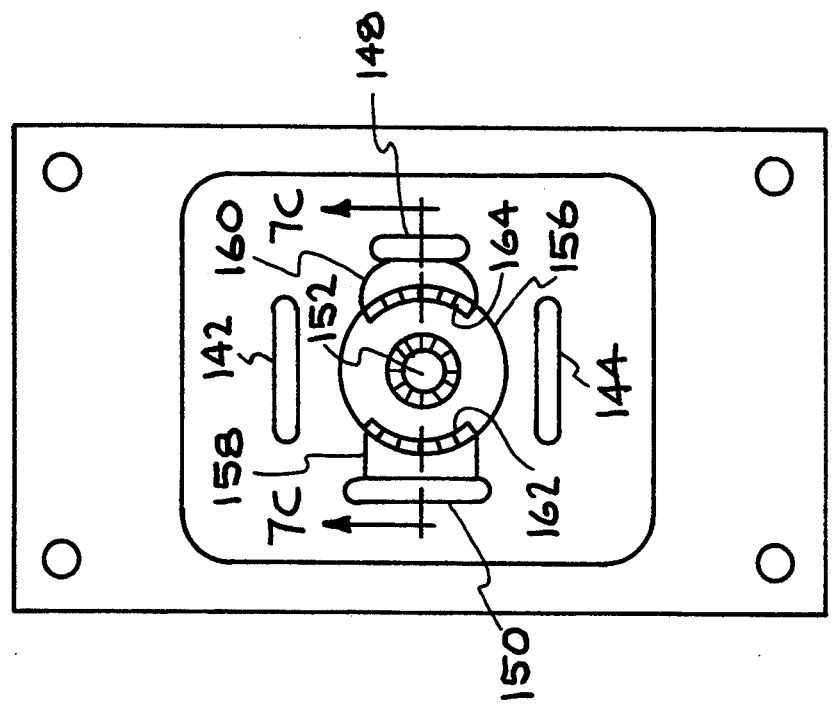
FIG. 7b illustrates the conductor coated grid side view of the 8755 version PC board.
Figure 7A:
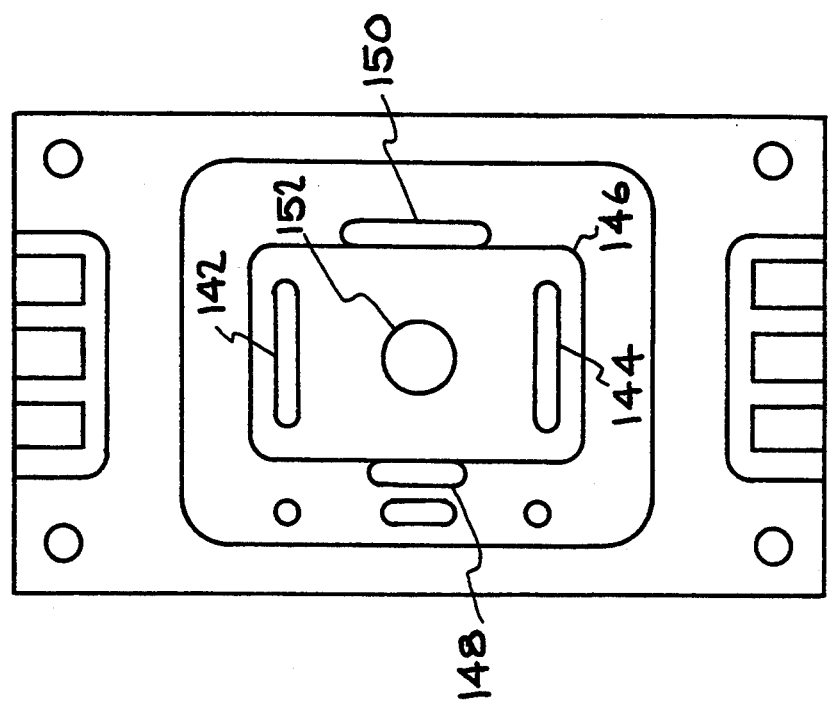
FIG. 7a illustrates the conductor coated cathode side view of the 8755 version PC board.

Referring now to FIGS. 7a-d, an alternative embodiment of the invention is illustrated and operates/assembles in a similar manner to that of FIG. 6a-d. Whereas the PC board triode socket embodiment of FIGS. 6a-d was designed specifically for the Y-690 planar triode of FIG. 1, the PC board triode socket of FIGS. 7a-d was designed specifically for the 8755 planar triode of FIG. 2. FIG. 7a corresponds to FIG. 6a wherein shaded areas correspond to conductive coatings on the cathode side of each PC board, and likewise shaded areas of FIGS. 6b and 7b describe conductive coatings of the grid side of each PC board.

Figure 7D:
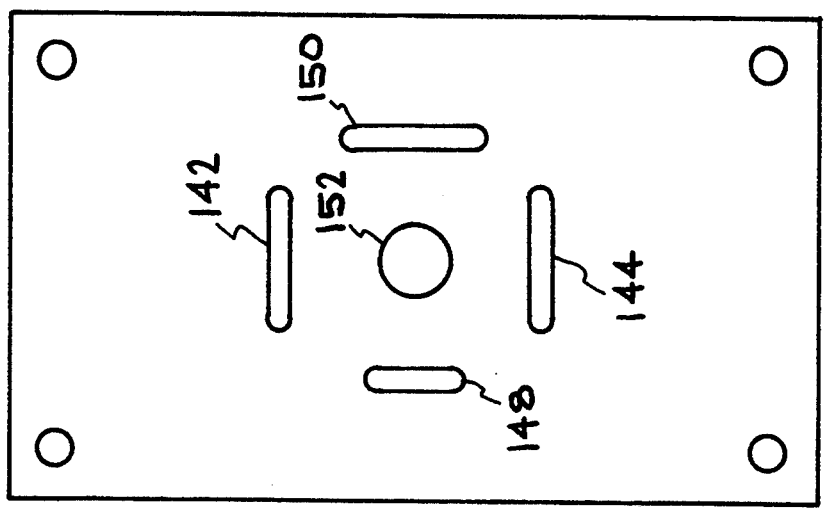
FIG. 7d illustrates the cathode side view of the holes for the PC board of the 8755 version PC board.

FIG. 7d delineates the particular hole and slot environment of the cathode side of the 8755 planar triode socket and corresponds to FIG. 6d which describes the hole and slot environment of the cathode side of the Y-690 planar triode socket. In FIG. 7d, slots 142 and 144 are configured to receive leg extensions from a similar but smaller triode retaining yoke (not illustrated) which would be fixedly soldered in place on the rectangular conductive coating 146 illustrated in FIG. 7a. In the 8755 triode socket, a second pair of slots 148 and 150 are provided for an alternative mounting and orientation of the leg extensions of the triode retaining yoke, or alternatively for bypass through the PC board of additional electronics.

Figure 7C:
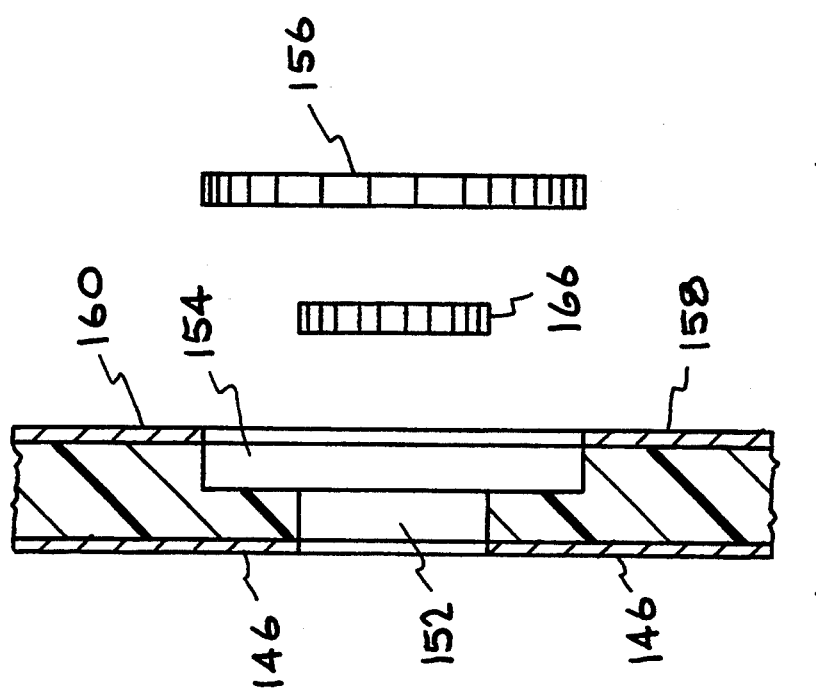
FIG. 7c is a cross section of the central cut out of FIG. 7b.

The cross section of FIG. 7b illustrated in FIG. 7c depicts an alternative electrical contact and triode retaining means to be applied around the periphery of planar triode insertion hole 152. A circular recess 154 concentric with triode hole 152 is configured to receive either a second circular finger stocking grid ring 156, FIG. 7c, for electrical contact with cylindrical grid 30 of the 8755 triode to grid conductive pads 158 and 160 or a pair of opposing arcs along 162 and 164 of circular ring 156, FIG. 7b, may be utilized contiguous to grid pads 158 and 160, respectively.

A cathode ring 166 consisting of a first ring of finger stocking, similar to the Y-690 socket, is applied around the periphery of triode hole 152 for contiguous contact but flexible removal with cathode 26 of the 8755 planar triode 11 and also conductive pad 146.

Figure 8:
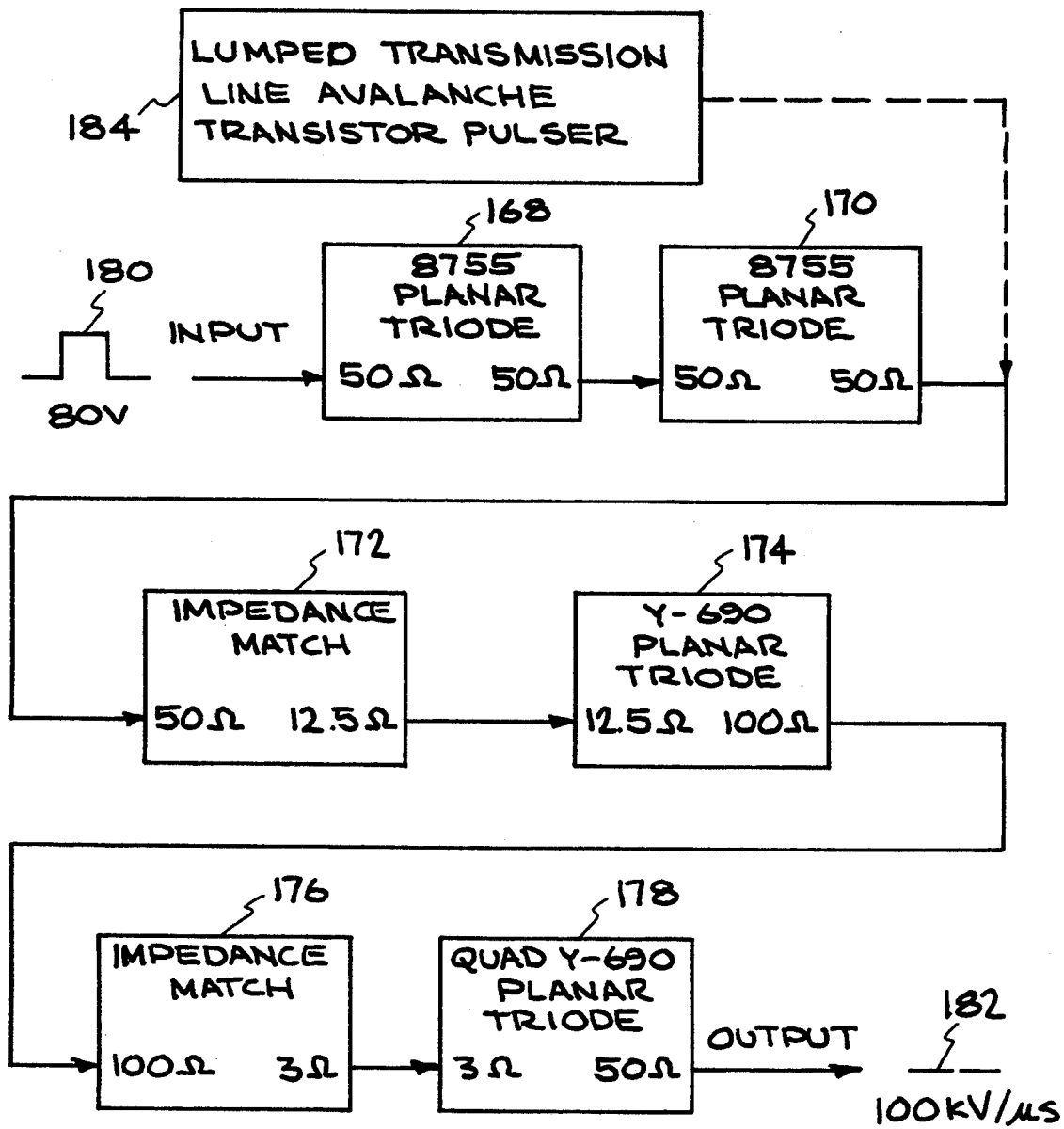
FIG. 8 is a box flow diagram of the series pulse generator system in which the 8755 and the Y-690 planar triodes and respective sockets are implemented.

FIG. 8 is included to illustrate one application of the printed circuit board mounted Y-690 and 8755 planar triodes of FIGS. 1 and 2, respectively.

First and second PCB mounted 8755 planar triodes 168 and 170 are coupled in series through a 50/12.5 Ω impedance match means 172 to a single PCB mounted Y-690 planar triode 174. Y-690 planar triode 174 in turn is coupled through a 100/3Ω impedance match means 176 to four parallel coupled Y-690 planar triodes 18 to amplify a low 80 volt broad pulsed input 180 to a high voltage, narrow pulse, 5 kV/100A-2ns-2ns-1μs, output 182.

By PC board mounting, the Y-690 and 8755 planar triodes can be more conveniently assembled, packaged and disassembled in the event of failure. Alternatively, it is a further intent to be able to use a PC board lumped transmission line avalanche transistor pulser 184 in place of and instead of the two series coupled 8755 triodes. Since the transistor pulser is inherently PC board oriented, a PC board mounted planar triode mates more effectively physically and electronically. In addition a PCB socket system enables mounting up to six planar triodes in parallel while easily providing for signal inputs and outputs, signal grounds and other assorted circuit connections, while also being convenient and easily adapted to a variety of circuit configurations.

The foregoing description of a preferred embodiment of the invention with certain variations on the concept have been presented for purposes of illustration and description. It is not intended to be exhaustive or to limit the invention to the precise form disclosed, and obviously many other modification and variations are possible light of the above techniques. The embodiments were chosen and described in order to best explain the principles of the invention concept and its practical reduction to practice and application to thereby enable others skilled in the art to best utilize the invention in various embodiments and with various modifications as are suited to the particular use contemplated. It is intended that the scope of the invention be more appropriately defined by the claims appended hereto.

I claim:

1. A planar triode, printed circuit board (PCB) socket, comprising:
   a PCB having a grid side and a cathode side, said PCB further having at least one cathode socket for insertion therein of a cathode element of at least one said planar triode;
   a first cathode conductive PC layer disposed on said cathode side of said PCB in communication with the periphery of said socket;
   a second cathode conductive PC layer disposed on said cathode side of said PCB electronically isolated from and surrounding said first cathode conductive PC layer;
   cathode contact means disposed on the periphery of said socket for releasably holding fast and making electrical contact between said cathode element of said planar triode and said first cathode PC layer;
   a first grid conductive PC layer disposed on said grid side of said PCB contiguous with at least one edge of said socket;
   a second grid conductive PC layer disposed on said grid side of said PCB electronically isolated from and surrounding said first grid conductive PC layer;
   grid contact means disposed on said grid side of said PCB concentric to said socket for making electrical contact between a grid element of said planar triode and said first grid conductive PC layer;
   at least one leg extension orthogonally extending from said grid side of said PCB and on at least one side of said socket, said extension passing through said PCB and making firm physical and electrical contact with said first cathode conductive PC layer; and
   an anode output yoke releasably coupled to said cathode leg extension, said yoke extending over and retaining said planar triode in said socket.

2. A planar triode PCB socket according to claim 1, wherein said cathode contact means for making electrical contact consists of a first ring of copper finger stocking disposed around the cathode side periphery of said socket and soldered to said first cathode conductive PC layer.

3. A planar triode PCB socket according to claim 1, wherein said grid contact means for making electrical contact consists of a conductive metal ring disposed around the grid side periphery of said socket and configured for slidable insertion into said grid element of said planar triode.

4. A planar triode PCB socket according to claim 3, wherein said conductive metal ring is supported a short distance from said PCB and electronically isolated from said cathode contact means by at least one conductive ring flange soldered to and extending from said first grid conductive PC layer.

5. A planar triode PCB socket according to claim 1, wherein said grid contact means consists of a second copper finger stocking ring disposed on said PCB grid side concentric to said first finger stocking ring.

6. A planar triode PCB socket according to claim 1, wherein said conductive leg extension consists of a brass bar soldered at a near end to said first cathode conductive layer, and having metal screw mounting holes at a distal end thereof.

7. A planar triode PCB socket according to claim 1, wherein said anode output yoke consists of a U shaped curved brass bar with the two legs thereof enveloping there between said planar triode and whereby at least one said leg thereof is connected with metal screws to at least one said leg extension.

8. A planar triode PCB socket according to claim 7, wherein said output yoke encloses a triangle shaped brass rod.

9. A planar triode PCB according to claim 8, wherein said output yoke further encloses a rectangular shaped brass rod having an orifice in one side thereof for insertion therein of said planar triode anode element.

10. A planar triode PCB socket according to claim 9, wherein at least one anode output capacitor is positioned between said triangular shaped rod and said rectangular shaped rod.

11. A planar triode PCB socket according to claim 1, wherein said first grid conductive PC layer is coupled through a pulse termination capacitor to ground on said second cathode PC layer.

12. A planar triode PCB socket according to claim 1, further having a coax input wherein a shield of said input coax is coupled to said first cathode PC layer and a center lead of said coax is coupled to said first grid PC layer.

13. A planar triode PCB socket according to claim 1, further having a coax anode output wherein a shield of said output coax is coupled to said anode output yoke and a center lead of said coax is coupled through said output capacitor to said anode/plate element of said planar triode.

14. A planar triode PCB socket according to claim 1, further having at least one grid holding bracket means for releasably maintaining said planar triode in said socket.

15. A method for making a PCB planar triode socket, comprising the steps of:
   etching a grid side of a dual sided PCB with a first grid conductive layer;
   etching a cathode side of said dual sided PCB with a first cathode conductive layer;
   creating at least one socket, hole in a communication with said etched first conductive layers for removable insertion therein of cathode element of said planar triode;
   providing pliant, flexible metallic contacts soldered to said respective first conductive layers for removable contact with said grid and cathode elements of said planar triode;

maintaining said planar triode in said socket by means of a removable anode output yoke bracket; and providing pulse termination means.

16. A method for making a planar triode socket according to claim 15, further providing the step of surrounding said first grid conductive layer with a second and detached grid conductive layer.

17. A method for making a planar triode socket according to claim 15, further providing the step of surrounding said first cathode conductive layer with a second and detached cathode conductive layer.

18. A method for making a planar triode according to claim 15, further providing at least a first and second recesses in said socket and insulated from each other.

19. A method for making a planar triode according to claim 18, wherein said first recess provides contact between the grid of said planar triode and said first grid conductive layer.

20. A method for making a planar triode according to claim 18, wherein said second recess provides contact between the cathode of said planar triode and said first cathode conductive layer.

* * * * *